(12) United States Patent
Huang

(10) Patent No.: US 9,691,907 B1
(45) Date of Patent: Jun. 27, 2017

(54) NON-VOLATILE MEMORY DEVICE AND MANUFACTURING METHOD THEREOF

(71) Applicant: UNITED MICROELECTRONICS CORP., Hsin-Chu (TW)

(72) Inventor: Shih-Chang Huang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/231,800

(22) Filed: Aug. 9, 2016

(30) Foreign Application Priority Data

Jul. 6, 2016 (TW) .............................. 105121399 A

(51) Int. Cl.
| | |
|---|---|
| *H01L 29/788* | (2006.01) |
| *H01L 29/423* | (2006.01) |
| *H01L 27/11521* | (2017.01) |
| *H01L 29/66* | (2006.01) |
| *H01L 21/28* | (2006.01) |

(52) U.S. Cl.
CPC .... *H01L 29/7887* (2013.01); *H01L 21/28273* (2013.01); *H01L 21/28282* (2013.01); *H01L 27/11521* (2013.01); *H01L 29/42328* (2013.01); *H01L 29/66825* (2013.01); *H01L 29/7889* (2013.01)

(58) Field of Classification Search
CPC ........... H01L 29/7887; H01L 29/42328; H01L 29/7889
See application file for complete search history.

(56) References Cited

U.S. PATENT DOCUMENTS 5,467,305 A * 11/1995 Bertin ................... H01L 27/115
257/298
8,507,974 B2 * 8/2013 Liu ................... H01L 29/42328
257/324
(Continued)

FOREIGN PATENT DOCUMENTS

CN    WO 2014/036676    *  3/2014    ............ H01L 27/115

OTHER PUBLICATIONS

Kotov, Three generations of Embedded SuperFlash split gate cell scaling progress and challenges, Leti Innovation Days—Memory Workshop 2013, Jun. 27, 2013.
(Continued)

*Primary Examiner* — Jamie C Niesz
(74) *Attorney, Agent, or Firm* — Winston Hsu

(57) ABSTRACT

A non-volatile memory device includes a plurality of memory cells. Each memory cell includes a vertical channel, a control gate, a floating gate, and an erase gate disposed on a substrate. The vertical channel extends upwards in a vertical direction. The control gate, the floating gate, and the erase gate surround the vertical channel respectively, and a part of the floating gate is surrounded by the control gate. The erase gate is disposed between the substrate and the floating gate in the vertical direction, and the floating gate include a tip extending toward the erase gate. The vertical channel and electrodes surrounding the vertical channel, such as the control gate, the floating gate, and the erase gate, are used to reduce the area of the memory cell on the substrate of the non-volatile memory device in the present invention. The density of the memory cells may be enhanced accordingly.

20 Claims, 11 Drawing Sheets

(56) References Cited

U.S. PATENT DOCUMENTS

| | | | |
|---|---|---|---|
| 8,878,281 B2* | 11/2014 | Huang | H01L 29/42328 |
| | | | 257/315 |
| 9,171,855 B2 | 10/2015 | Tan | |
| 9,406,689 B2* | 8/2016 | Li | H01L 21/845 |
| 2005/0269626 A1 | 12/2005 | Forbes | |
| 2007/0004134 A1 | 1/2007 | Vora | |
| 2012/0299098 A1 | 11/2012 | Liu | |
| 2015/0008451 A1 | 1/2015 | Su | |

OTHER PUBLICATIONS

Aritome, A novel three-dimensional dual control-gate with surrounding floating-gate (DC-SF) NAND flash cell, Solid-State Electronics, vol. 79, Jan. 2013, pp. 166-171.

Huang, Novel vertical channel double gate structures for high density and low power flash memory applications, Science in China Series F: Information Sciences, vol. 51, Issue 6, pp. 799-806, Jun. 2008.

Lee, Vertical floating-gate 4.5F2 Split-gate NOR Flash Memory at 110nm Node, 2004 Symposium on VLSI Technology Digest of Technical Papers, Jun. 15, 2004.

* cited by examiner

NON-VOLATILE MEMORY DEVICE AND MANUFACTURING METHOD THEREOF

BACKGROUND OF THE INVENTION

1. Field of the Invention

The present invention relates to a non-volatile memory device and a manufacturing method thereof, and more particularly, to a non-volatile memory device including a vertical channel and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The non-volatile memory devices, which can retain their data even when the power supply is interrupted, have been widely employed. As one kind of the non-volatile memory technology, a SONOS memory structure is to build a silicon nitride layer sandwiched between two silicon oxide layers for serving as the charge trapping layer while the two silicon oxide layers respectively serve as a charge tunnel layer and a charge block layer. This oxide-nitride-oxide (ONO) multilayered structure is disposed on a semiconductor substrate, a silicon floating gate may be disposed on the ONO multilayered structure, and thus a SONOS memory structure is constructed.

Since the microprocessors have become more powerful, requirement to memory devices of large-capacity and low-cost is raised. To satisfy such trend and achieve challenge of high integration in semiconductor devices, memory miniaturization is kept on going, and thus fabrication process of memory structure is getting complicated. Therefore, it is always a target for the related industries to effectively enhance integrity and density of the memory cells by modifying the designs.

SUMMARY OF THE INVENTION

A non-volatile memory device and a manufacturing method thereof are provided in the present invention. A vertical channel extending upwards in a vertical direction is formed on a substrate. A control gate, a floating gate, and an erase gate formed on the substrate surround a part of the vertical channel respectively. An area of each memory cell on the substrate is reduced, and the density of the memory cells may be increased accordingly.

According to an embodiment of the present invention, a non-volatile memory device is provided. The non-volatile memory device includes a substrate and a plurality of memory cells. Each of the memory cells includes a vertical channel, a control gate, a floating gate, and an erase gate. The vertical channel is disposed on the substrate, and the vertical channel extends upwards in a vertical direction. The control gate, the floating gate, and the erase gate are disposed on the substrate and surrounding a part of the vertical channel respectively. A part of the floating gate is surrounded by the control gate. The erase gate is disposed between the substrate and the floating gate in the vertical direction, and the floating gate includes a tip extending toward the erase gate.

According to an embodiment of the present invention, a manufacturing method of a non-volatile memory device is provided. The manufacturing method includes the following steps. An erase gate, a control gate and a floating gate are formed on a substrate. A part of the floating gate is surrounded by the control gate, the erase gate is disposed between the substrate and the floating gate in a vertical direction, and the floating gate includes a tip extending toward the erase gate. A vertical channel is then formed on the substrate. The vertical channel extends upwards in the vertical direction. The floating gate, the control gate, and the erase gate surround the vertical channel respectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-10 are schematic drawings illustrating a manufacturing method of the non-volatile memory device according to the first embodiment of the present invention, wherein FIG. 3 and FIG. 4 are schematic drawings in a step subsequent to FIG. 2, FIG. 3 is a cross-sectional diagram taken along a line A-A' in FIG. 4, FIG. 5 is a schematic drawing in a step subsequent to FIG. 3, FIG. 6 and FIG. 7 are schematic drawings in a step subsequent to FIG. 5, FIG. 6 is a cross-sectional diagram taken along a line B-B' in FIG. 7, FIG. 8 and FIG. 9 are schematic drawings in a step subsequent to FIG. 6, FIG. 8 is a cross-sectional diagram taken along a line C-C' in FIG. 9, and FIG. 10 is a schematic drawing in a step subsequent to FIG. 8.

DETAILED DESCRIPTION

Figure 1:
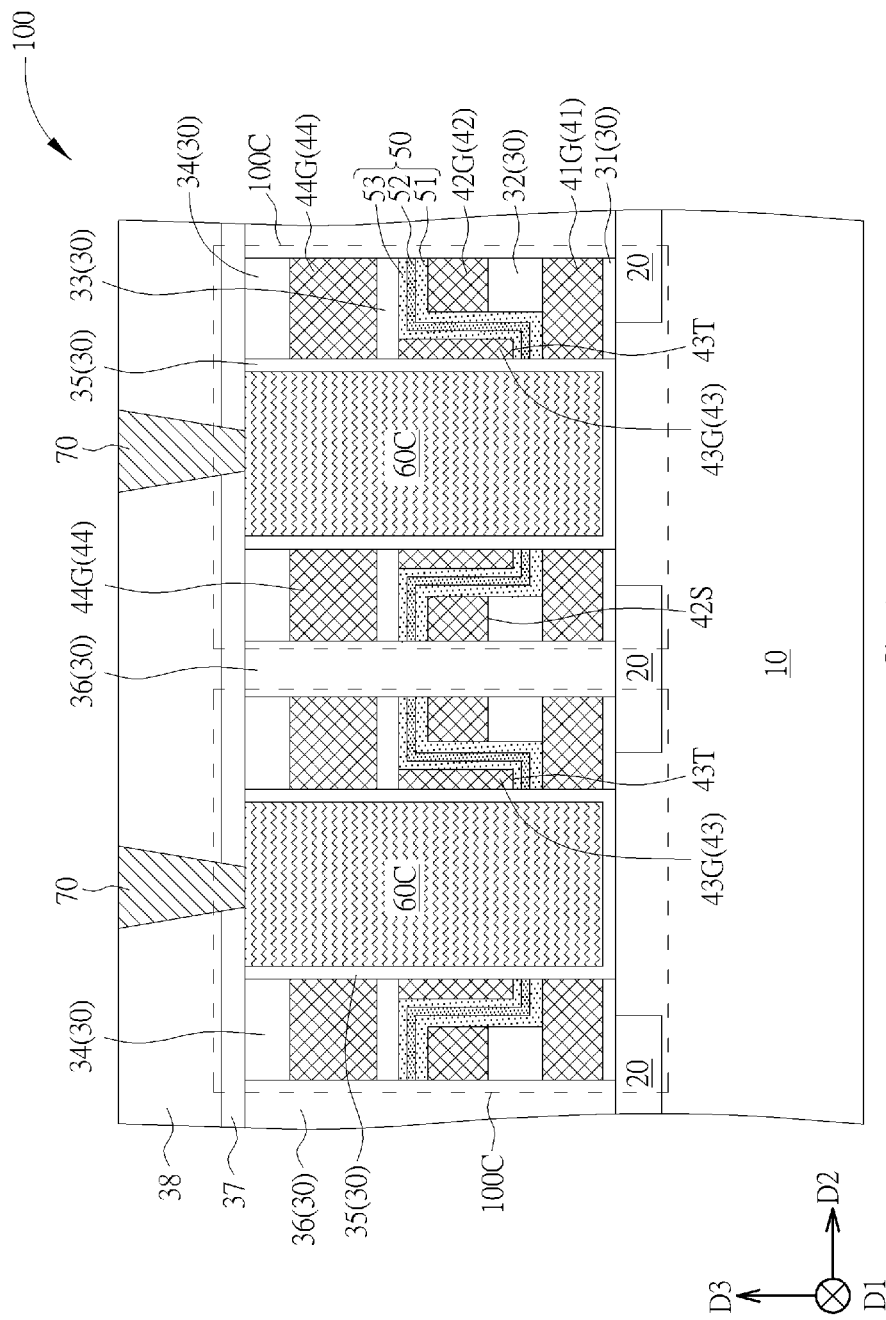
FIG. 1 is a schematic drawing illustrating a non-volatile memory device according to a first embodiment of the present invention.

Please refer to FIG. 1. FIG. 1 is a schematic drawing illustrating a non-volatile memory (NVM) device according to a first embodiment of the present invention. As shown in FIG. 1, a non-volatile memory device 100 is provided in this embodiment. The non-volatile memory device 100 includes a substrate 10 and a plurality of memory cells 100C. The substrate 10 may include a semiconductor substrate or a non-semiconductor substrate. The semiconductor substrate mentioned above may include a silicon substrate, an epitaxial silicon substrate, a silicon germanium substrate, a silicon carbide substrate, or a silicon-on-insulator (SOI) substrate for example, and the non-semiconductor substrate mentioned above may include a glass substrate, a plastic substrate, or a ceramic substrate for example, but not limited thereto. Each of the memory cells 100C includes a vertical channel 60C, a control gate 42G, a floating gate 43G, and an erase gate 41G. The vertical channel 60C is disposed on the substrate 10, and the vertical channel 60C extends upwards in a vertical direction D3. In other words, the vertical channel 60C may be disposed above a top surface of the substrate 10 and extend in a direction away from the substrate 10. The vertical channel 60C may be formed by a semiconductor material such as polysilicon, but not limited thereto. The control gate 42G, the floating gate 43G, and the erase gate 41G are disposed on the substrate 10 and surround a part of the vertical channel 60C respectively. For example, the control gate 42G, the floating gate 43G, and the erase gate 41G may surround a part of the vertical channel 60C in horizontal directions (such as a first direction D1 and a second direction D2 shown in FIG. 1) orthogonal to the vertical direction D3. Additionally, a part of the floating gate 43G is surrounded by the control gate 42G. In other words, the control gate 42G may surround a part of the vertical channel 60C and a part of the floating gate 43G in the horizontal directions. The erase gate 41G is disposed between the substrate 10 and the floating gate 43G in the vertical direction D3, and the floating gate 43G includes a tip 43T extending toward the erase gate 41G.

Specifically, the tip 43T of the floating gate 43G is lower than a bottom surface 42S of the control gate 42G in the vertical direction D3 preferably. The tip 43T of the floating gate 43G may be used to advantage erasing operations of the erase gate 41G toward the floating gate 43G, and that will be beneficial for enhancing the erase speed of the non-volatile memory device 100.

In this embodiment, an interlayer dielectric 30 may be disposed between the vertical channel 60C, the control gate 42G, the floating gate 43G, and the erase gate 41G for separating the vertical channel 60C, the control gate 42G, the floating gate 43G, and the erase gate 41G from one another. The interlayer dielectric 30 may be composed of a plurality of dielectric layers. For example, each of the memory cells 100C may further include a dielectric layer (such as a third dielectric layer 50 shown in FIG. 1) and a second dielectric layer 35. The third dielectric layer 50 is disposed on the substrate 10 and surrounds a part of the vertical channel 60C. A part of the third dielectric layer 50 is disposed between the floating gate 43G and the control gate 42G, and another part of the third dielectric layer 50 is disposed between the floating gate 43G and the erase gate 41G. The second dielectric layer 35 is disposed on the substrate 10 and surrounds the vertical channel 60C. A part of the second dielectric layer 35 is disposed between the vertical channel 60C and the substrate 10 in the vertical direction D3, and a part of the second dielectric layer 35 is disposed between the vertical channel 60C and the floating gate 43G.

In some embodiments of the present invention, the control gate 42G and the erase gate 41G may be formed by a conductive material, such as conductive polysilicon, respectively. The floating gate 43G may include a conductive material, such as conductive polysilicon, or a charge trapping material, such as a nitride layer, and the floating gate 43G is electrically floating without being connected with any conductive line. Additionally, the second dielectric layer 35 may be formed by oxide, such as silicon oxide, or other appropriate dielectric materials, and the third dielectric layer 50 may be a single dielectric layer or a multiple dielectric layer structure according to different design considerations. For example, when the floating gate 43G is made of conductive materials such as polysilicon, the third dielectric layer 50 may include a multiple layer structure, such as a multiple layer structure composed of a first oxide layer 51, a nitride layer 52, and a second oxide layer 53 disposed overlapping one another sequentially. In other words, the nitride layer 52 is disposed on the first oxide layer 51, and the second oxide layer 53 is disposed on the nitride layer 52. In this condition, the third dielectric layer 50 may be regarded as an oxide-nitride-oxide (ONO) multiple layer structure, and charges may be stored in the floating gate 43G during the operation of the memory cell 100C, but not limited thereto.

In some embodiments of the present invention, when the floating gate 43G is made of a charge strapping material such as a nitride layer, the third dielectric layer 59 may be a single dielectric layer such as an oxide layer preferably, and the second dielectric layer 35 may also be an oxide layer preferably. In this condition, the third dielectric layer 50 disposed between the control gate 42G and the vertical channel 60C, the floating gate 43G, and the second dielectric layer 35 may form an oxide-nitride-oxide (ONO) structure, and charges may be trapped and stored in the floating gate 43G during the operation of the memory cell, but not limited thereto.

As shown in FIG. 1, each of the memory cells 100C may further include a selecting gate 44G disposed on the substrate 10 and surrounding a part of the vertical channel 60C. In this embodiment, the selecting gate 44G is disposed above the floating gate 43G, the control gate 42G, and the erase gate 41G. The floating gate 43G, the control gate 42G, and the erase gate 41G are disposed between the selecting gate 44G and the substrate 10 in the vertical direction D3. The selecting gate 44G may be connected to a word line (not shown in FIG. 1) or be a part of a word line. The selecting gate 44G may be formed by a conductive material, such as a conductive polysilicon material, but not limited thereto. In addition, the non-volatile memory device 100 may further include a plurality of source lines 20 and a plurality of bit lines 70. In this embodiment, the source lines 20 are disposed in the substrate 10, and the erase gate 41G, the control gate 42G, and the selecting gate 44G are disposed above one of the source lines 20 in the vertical direction D3. Additionally, a dielectric layer 31 may be disposed between the erase gate 41G and the source line 20 for separating the source line 20 from the erase gate 41G. In this embodiment, the source lines 20 may be formed by forming a conductive material such as a conductive polysilicon material in trenches on the surface of the substrate 10, but the present invention is not limited to this. In some embodiments of the present invention, other materials and/or other approaches (such as a local doping process performed to the substrate 10 when the substrate 10 is a semiconductor substrate) may also be used to form the source lines 20 according to other design considerations. In addition, each of the bit lines 70 is disposed on the vertical channel 60C and is connected to the vertical channel 60C, but not limited thereto. In some embodiments, a connection structure may be formed on the vertical channel 60C, the connection structure may contact and be connected to the vertical channel 60C, and the bit lines 20 may be electrically connected to the connection structure by a direct connection or an indirect connection.

In the non-volatile memory device 100, each of the memory cells 100C cooperates with the corresponding word line, the corresponding bit line 70, and the corresponding source line 20. For example, in a programming operation, a voltage (such as 1 volt) may be applied to the word line, a current (such as 1 μA) may be applied to the bit line 70, a voltage (such as 10.5 volts) may be applied to the control gate 42G, and a relatively low voltage (such as 4.5 volts) may be applied to the erase gate 41G and the source line 20 respectively for making charges enter the floating gate 43G from the vertical channel 60C. In a reading operation, the erase gate 41G and the source line 20 may not be applied voltages, a voltage (such as 0.8 volt) may be applied to bit line 70, and a relatively low voltage (such as 2.5 volts) may be applied to the control gate 42G and the word line (i.e. the selecting gate 44G) respectively for generating current in the vertical channel 60C depending on the condition of the floating gate 43G, and the current in the vertical channel 60C may be read. In an erasing operation, the word line (i.e. the selecting gate 44G), the bit line 70, the source line 20, and the control gate 42G may not be applied voltages, and a relatively high voltage (such as 11.5 volts) may be applied to the erase gate 41G only for removing the charges stored in the floating gate 43G. However, the non-volatile memory device 100 in this embodiment is not limited to the operation methods described above, and other approaches for the programming operation, the reading operation, and/or the erasing operation in the non-volatile memory device 100 are within the contemplated scope of the present invention.

The non-volatile memory device 100 in this embodiment may be regarded as a split gate memory device. The required area of the erase gate 41G, the control gate 42G, the floating gate 43G, and the selecting gate 44G on the substrate 10 may be effectively reduced because the erase gate 41G, the control gate 42G, the floating gate 43G, and the selecting gate 44G of each of the memory cells 100C are disposed overlapping one another in the vertical direction D3 and respectively surround the vertical channel 60C extending vertically in the horizontal directions. The purpose of increasing the density of the memory cells 100C in the non-volatile memory device 100 may be achieved accordingly. In addition, in some embodiments of the present invention, at least some of the memory cells 100C may be disposed overlapping one another in the vertical direction D3 for further increasing the density of the memory cells in the non-volatile memory device.

FIGS. 2-10 may be used to illustrate a manufacturing method of the non-volatile memory device 100 in this embodiment. However, it should be noted that the manufacturing method of the non-volatile memory device 100 is not limited to the contents of FIGS. 2-10. Other suitable approaches for manufacturing the non-volatile memory device 100 mentioned above are within the contemplated scope of the present invention.

Figure 2:
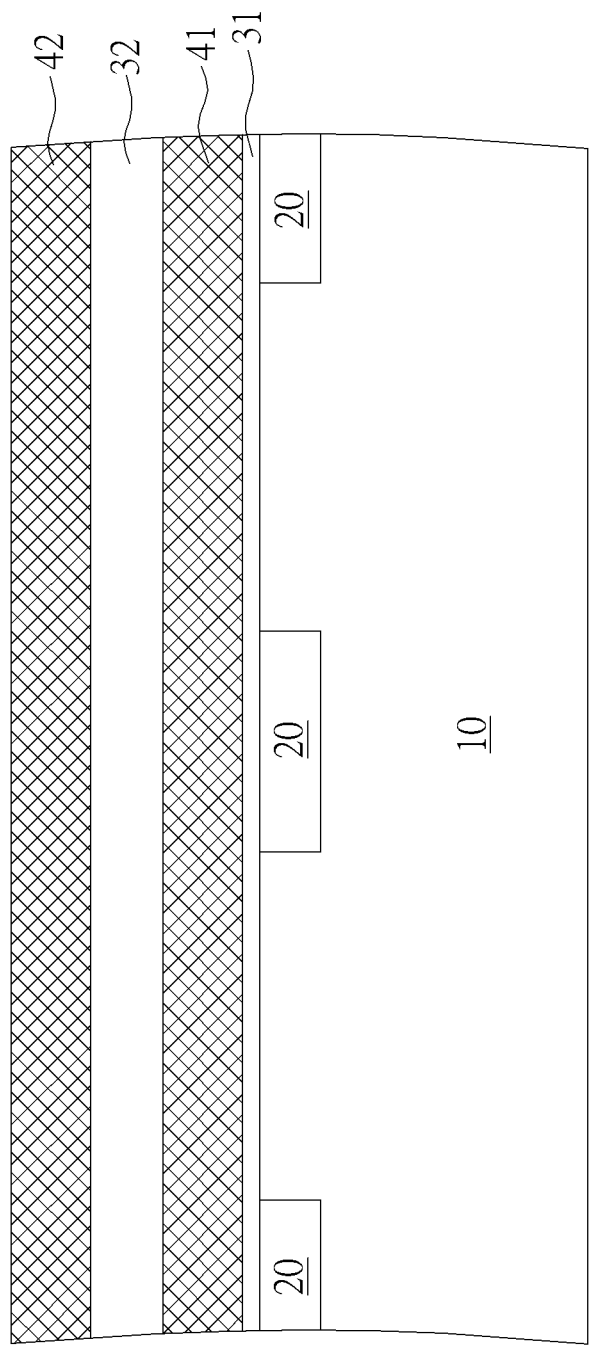
Figure 3:
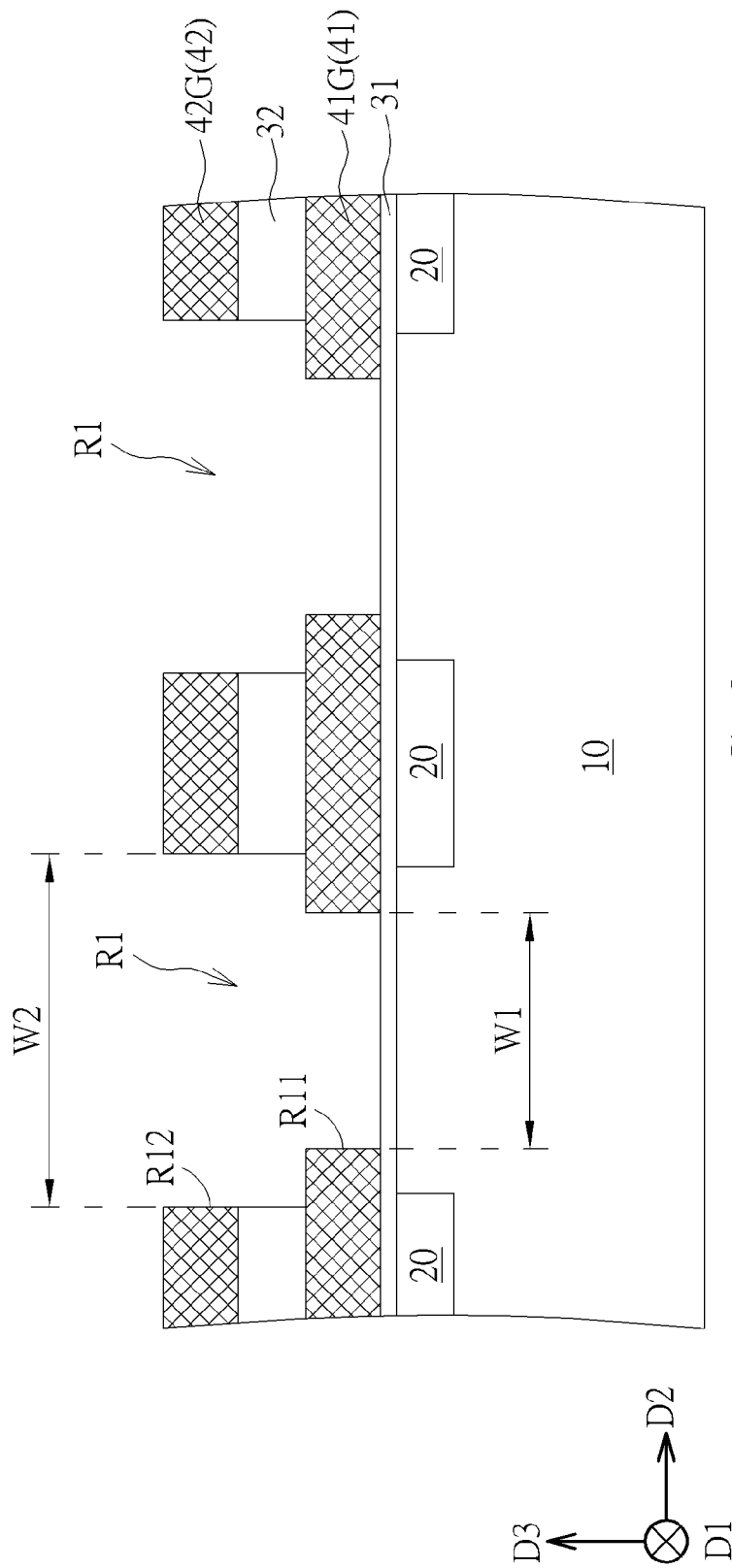
Figure 4:
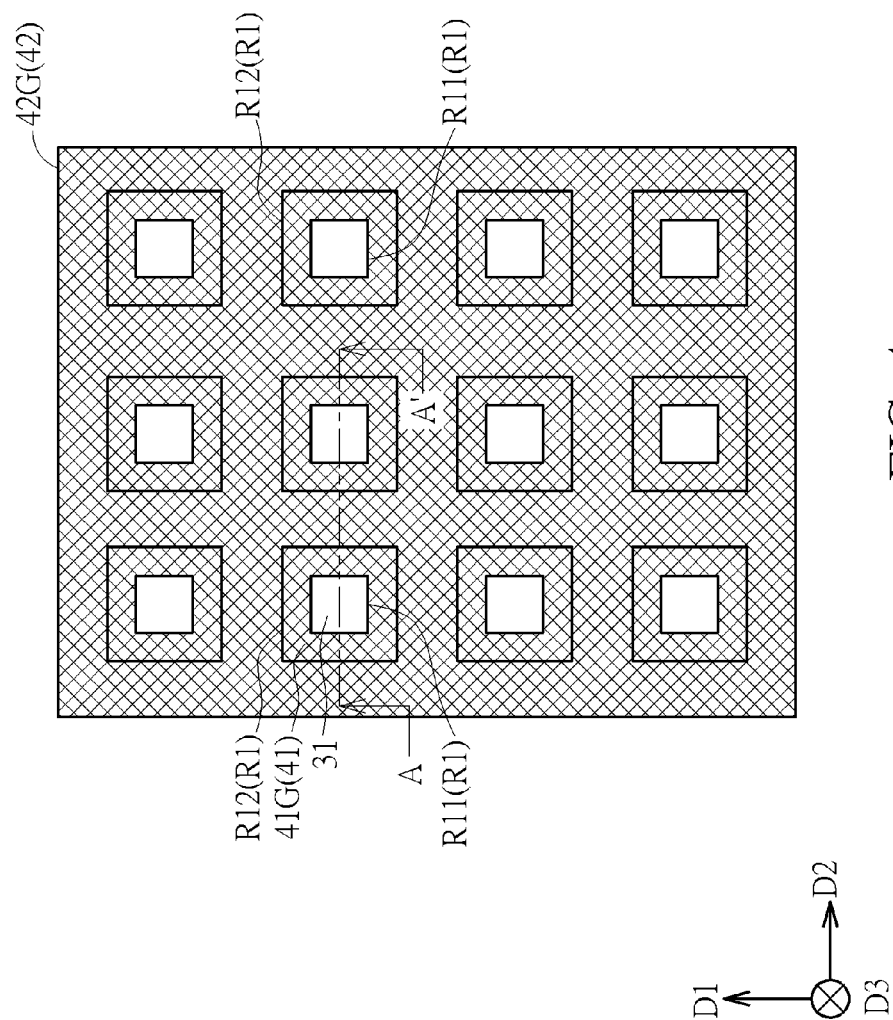
Figure 5:
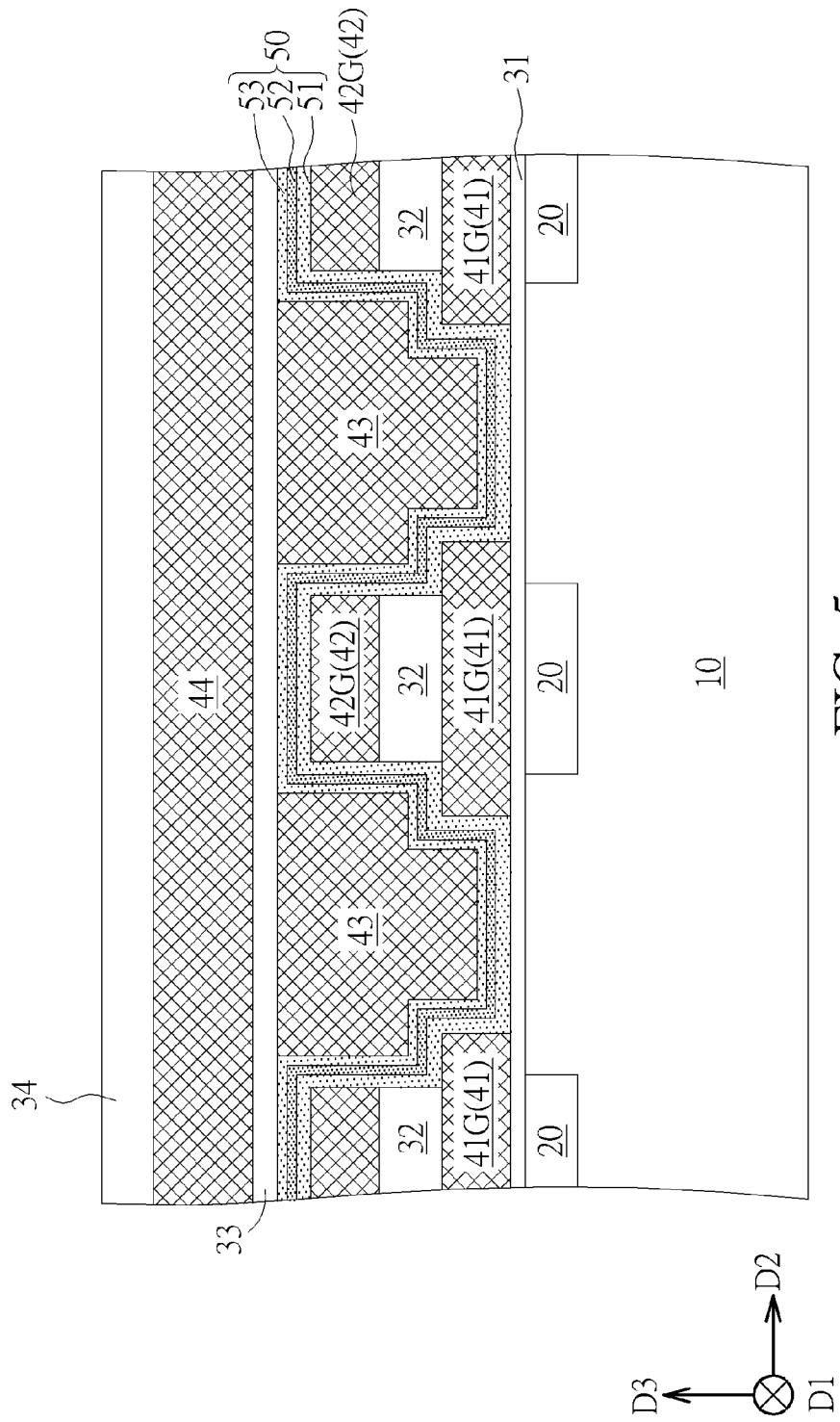
Figure 6:
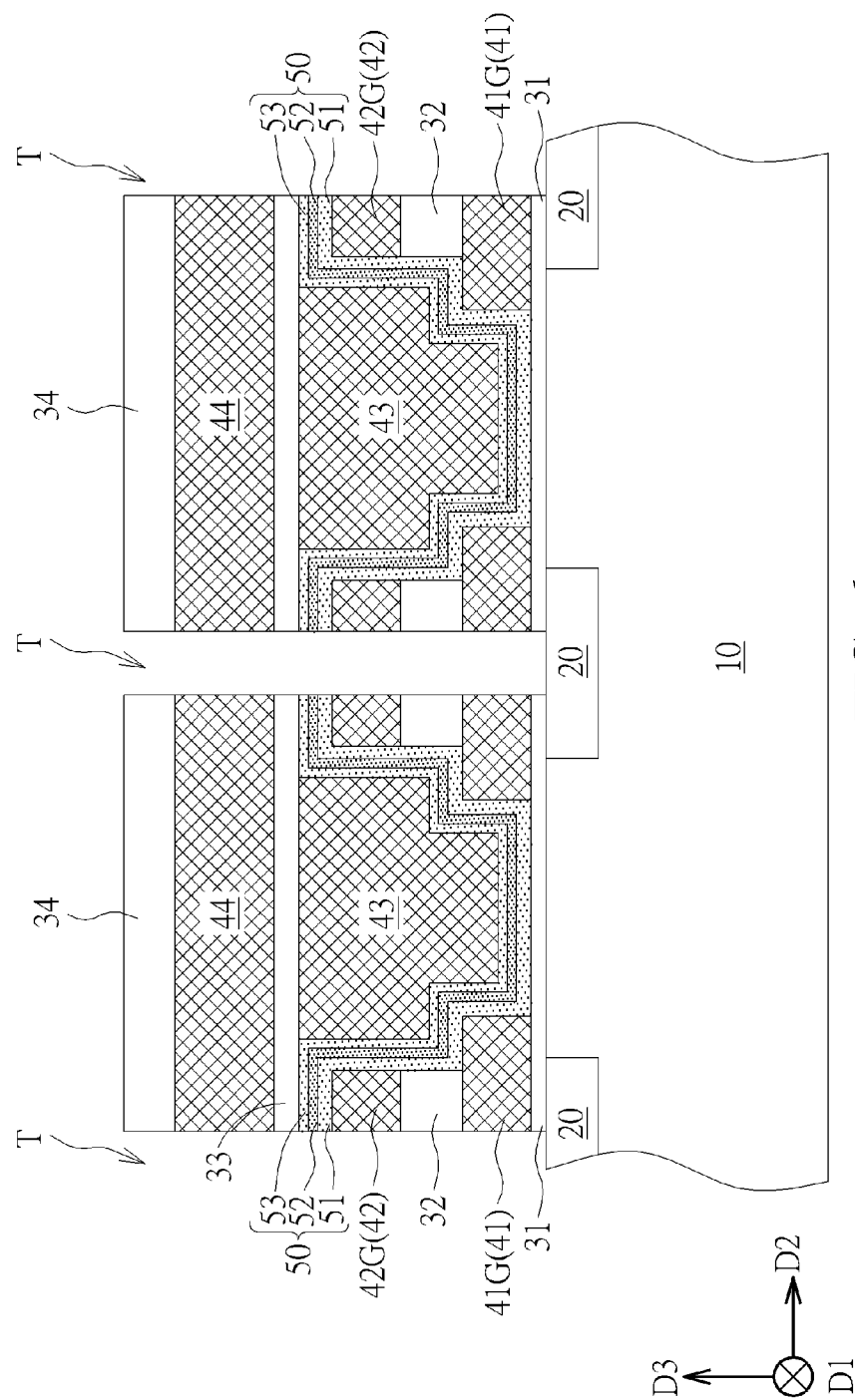
Figure 7:
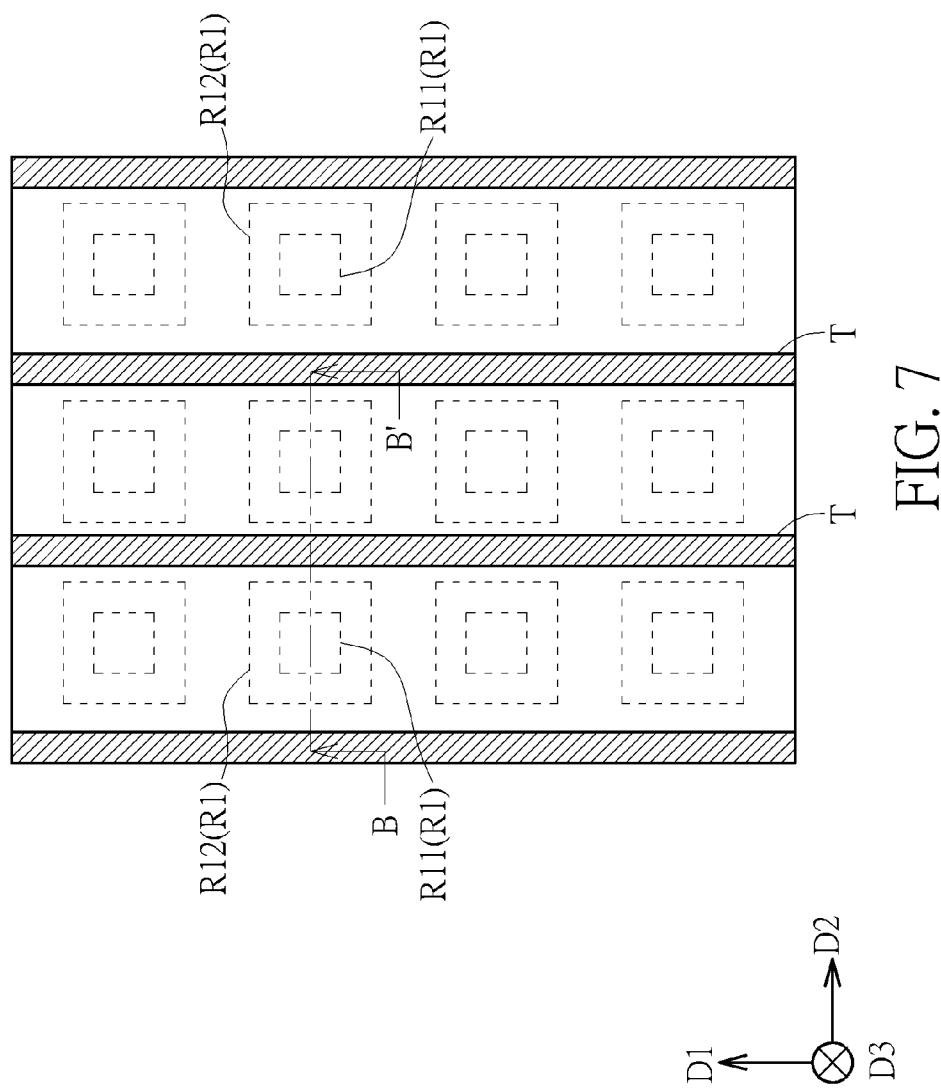
Figure 8:
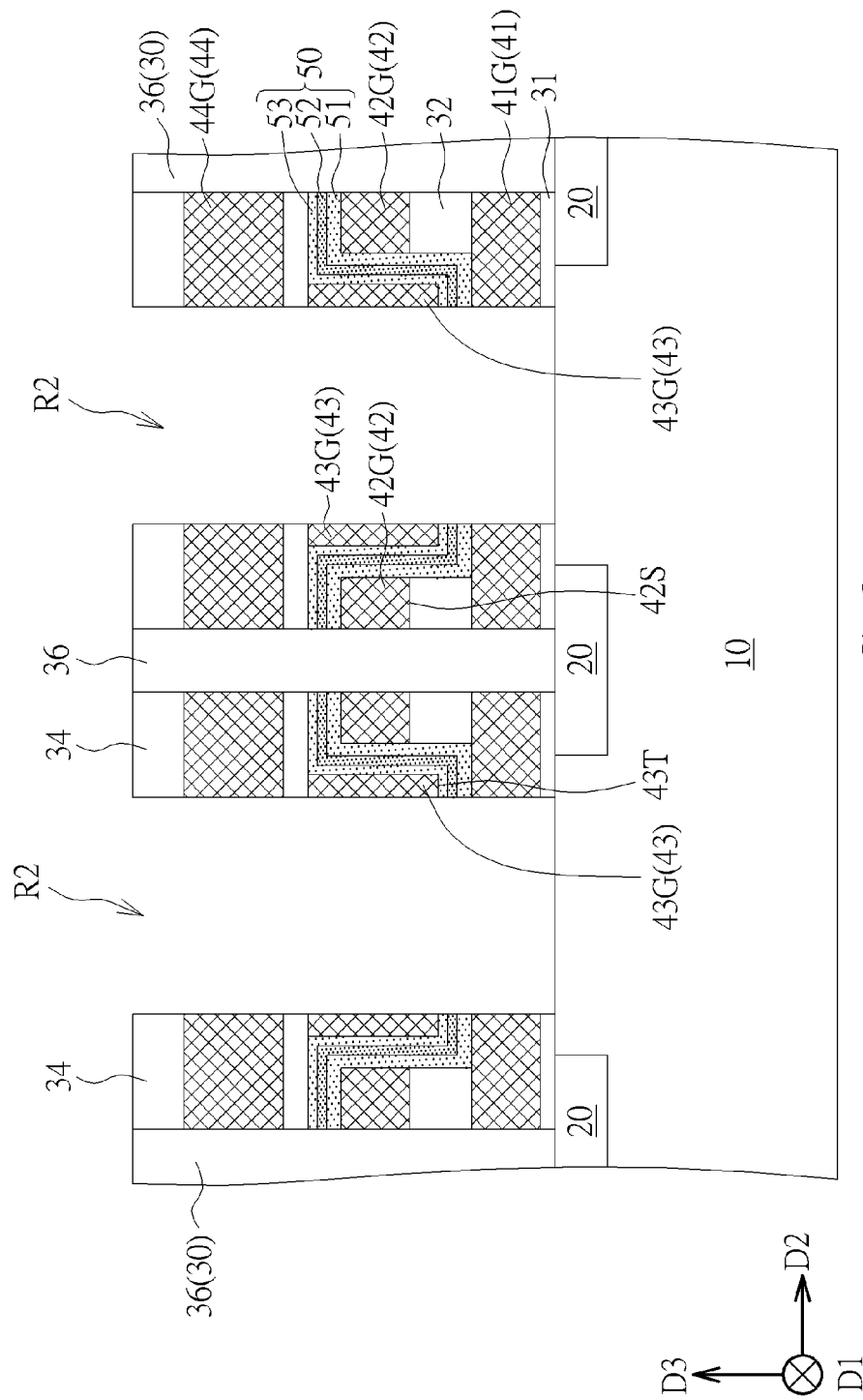
Figure 9:
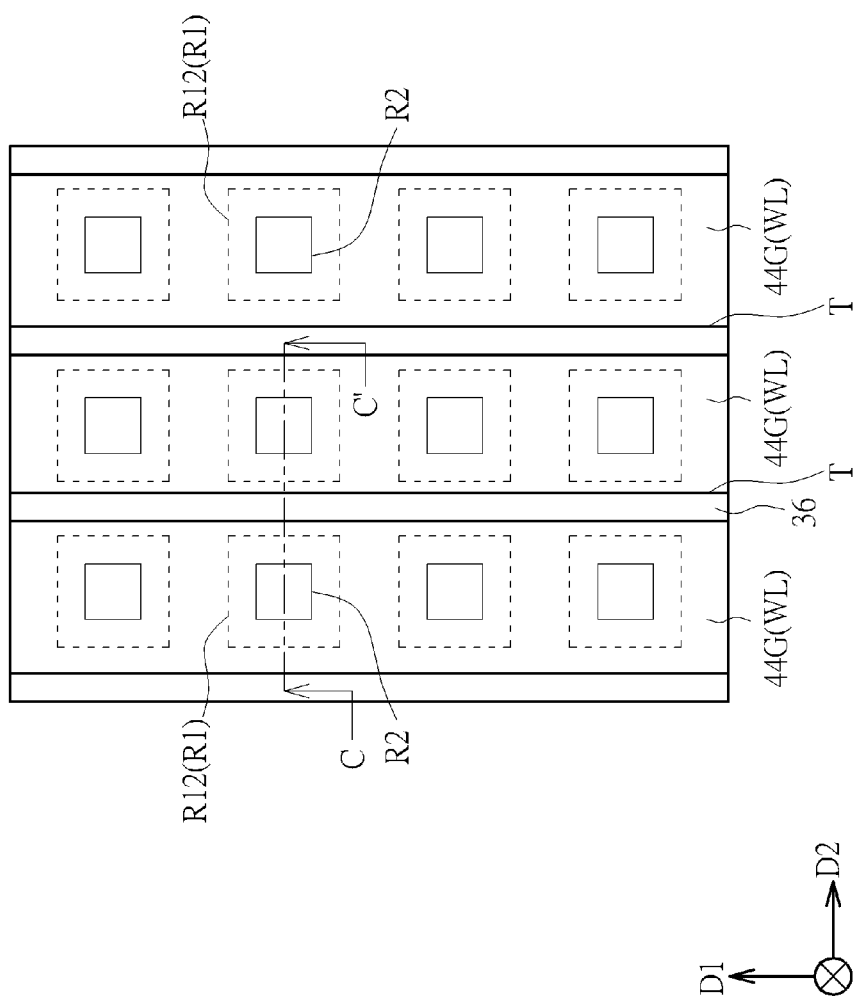

Please refer to FIGS. 1-10. FIGS. 2-10 are schematic drawings illustrating a manufacturing method of the non-volatile memory device according to the first embodiment of the present invention. FIG. 4, FIG. 7, and FIG. 9 are top-view diagrams. FIG. 3 may be regarded as a cross-sectional diagram taken along a line A-A' in FIG. 4. FIG. 6 may be regarded as a cross-sectional diagram taken along a line B-B' in FIG. 7. FIG. 8 may be regarded a cross-sectional diagram taken along a line C-C' in FIG. 9. As shown in FIG. 1, the manufacturing method of the non-volatile memory device 100 in this embodiment includes the following steps. The erase gate 41G, the control gate 42G, and the floating gate 43G are formed on the substrate 10. Apart of the floating gate 43G is surrounded by the control gate 42G, the erase gate 41G is disposed between the substrate 10 and the floating gate 43G in the vertical direction D3, and the floating gate 43G includes the tip 43T extending toward the erase gate 41G. The vertical channel 60C is then formed on the substrate 10. The vertical channel 60C extends upwards in the vertical direction D3. The floating gate 43G, the control gate 42G, and the erase gate 41G surround the vertical channel 60C respectively.

Specifically, the method of forming the floating gate 43G, the control gate 42G, and the erase gate 41G may include the following steps. As shown in FIG. 2, the dielectric layer 31, a first conductive layer 41, a first dielectric layer 32, and a second conductive layer 42 are sequentially formed on the substrate 10. The dielectric layer 31 and the first dielectric layer 32 may include an oxide dielectric layer, such as a silicon oxide layer, or a dielectric layer made of other appropriate materials respectively. The dielectric layer 31 and the first dielectric layer 32 may be formed by suitable methods such as a chemical vapor deposition process. The first conductive layer 41 and the second conductive layer 42 may include a conductive polysilicon material or other appropriate conductive materials respectively. Additionally, the source lines 20 may be formed in the substrate 10 before the step of forming the dielectric layer 31. A plurality of trenches may be formed on the surface of the substrate 10 first, and a conductive material such as a polysilicon material may then be formed in the trenches for forming the source lines 20, but not limited thereto.

As shown in FIG. 3 and FIG. 4, a plurality of first recesses R1 may then be formed. Each of the first recesses R1 penetrates the second conductive layer 42, the first dielectric layer 32, and the first conductive layer 41 for forming the control gate 42G and the erase gate 41G. In some embodiments, the first recesses R1 may not penetrate the dielectric layer 31. However, in some embodiments, the first recess R1 may penetrate the dielectric layer 31 for exposing a part of the substrate 10 according to other design considerations. It is worth noting that the first recesses R1 may be separated from one another and repeatedly disposed in the first direction D1 and the second direction D2 for forming an array configuration. The first direction D1 may be substantially orthogonal to the second direction D2, but not limited thereto. In addition, each of the first recesses R1 may include a first part R11 and a second part R12. The first part R11 and the second part R12 are connected with each other. The first part R11 penetrates the first conductive layer 41, and the second part R12 penetrates the second conductive layer 42 and the first dielectric layer 32. A width W2 of the second part R12 is larger than a width W1 of the first part R11, and the second part R12 exposes a part of the first conductive layer 41 in the vertical direction D3. In other words, in each of the first recesses R1, an aperture penetrating the first conductive layer 41 is smaller than an aperture penetrating the second conductive layer 42 and the first dielectric layer 32. A center of the aperture penetrating the first conductive layer 41 and a center of the aperture penetrating the second conductive layer 42 and the first dielectric layer 32 substantially overlap each other in the vertical direction D3. Therefore, in the top-view diagram (such as FIG. 4), the erase gate 41G exposed by the second part R12 may have a close pattern surrounding the first part R11.

As shown in FIG. 3 and FIG. 5, a floating gate material layer 43 is formed in the first recesses R1. Each of the first recesses R1 may be filled with the floating gate material layer 43 preferably, and the floating gate material layer 43 may include a conductive material such as a conductive polysilicon material or a charge trapping material such as a nitride layer. Additionally, the third dielectric layer 50 may be formed conformally in the first recesses R1 before the step of forming the floating gate material layer 43. The third dielectric layer 50 may be a single dielectric layer or a multiple dielectric layer structure according to different design considerations. For example, the first oxide layer 51, the nitride layer 52, and the second oxide layer 53 may be sequentially formed conformally in the first recesses R1. The third dielectric layer 50 may be formed on the erase gate 41G exposed by the first recess R1, a sidewall of the first dielectric layer 32, and a top surface and a sidewall of the control gate 42G. In other words, the first recesses R2 may be filled with the floating gate material layer 43 after the step of forming the third dielectric layer 50. The top surface of the third dielectric layer 50 disposed on the control gate 42G may be substantially coplanar with the top surface of the floating gate material layer 43 by processes such as an etching back process or a planarization process, but not limited thereto. Subsequently, a dielectric layer 33, a third conductive layer 44, and a dielectric layer 34 are sequentially formed on the floating gate material layer 43 and the third dielectric layer 50. The dielectric layer 33 and the dielectric layer 34 may respectively include an oxide dielectric layer, such as a silicon oxide layer, or a dielectric layer made of other appropriate materials. The third conductive layer 44 may include a conductive polysilicon material or other appropriate conductive materials.

As shown in FIG. 6 and FIG. 7, a plurality of trenches T are formed. Each of the trenches T penetrates the dielectric layer 34, the third conductive layer 44, the dielectric layer 33, the third dielectric layer 50, the second conductive layer 42 (may also be regarded as the control gate 42G), the first dielectric layer 32, and the first conductive layer 41 (may also be regarded as the erase gate 41G). Each of the trenches T may extend in the first direction D1, and the trenches T may be parallel with one another and repeatedly disposed in the second direction D2. In other words, each of the trenches T may be formed between two of the first recesses R1 disposed adjacently in the second direction D2, and each of the trenches T may be formed above one of the source lines 20, but not limited thereto. It is worth noting that the first conductive layer 41, the second conductive layer 42, and the third conductive layer 44 may be cut by the formation of the trenches T for forming a plurality of conductive lines extending in the first direction D1. These conductive lines may be used to control the electrical conditions of the erase gate 41G, the control gate 42G, and the selecting gate (not shown in FIG. 6 and FIG. 7). For example, the third conductive layer 44 cut by the trench T may be regarded as a basis for forming the word lines subsequently, but not limited thereto.

As shown in FIG. 8 and FIG. 9, a dielectric layer 36 is formed in the trenches T, and a plurality of second recesses R2 may then be formed. The trench T may be filled with a dielectric material, such as an oxide dielectric material, for forming the dielectric layer 36. A top surface of the dielectric layer 36 may be substantially coplanar with a top surface of the dielectric layer 34 by processes such as an etching back process or a planarization process, but not limited thereto. Each of the second recesses R2 penetrates the dielectric layer 34, the third conductive layer 44, the dielectric layer 33, and the floating gate material layer 43 in the first recess R1. The floating gate material layer 43 is penetrated by the second recess R2 for forming the floating gate 43G, and the third conductive layer 44 is penetrated by the second recess R2 for forming the selecting gate 44G. The selecting gate 44G is formed above the floating gate 43G, the control gate 42G, and the erase gate 41G. The erase gate 41G, the control gate 42G, and the selecting gate 44G are formed above the corresponding source line 20 in the vertical direction D3. Additionally, the first oxide layer 51, the nitride layer 52, and the second oxide layer 53 of the third dielectric layer 50 are also penetrated by the second recess R2. After the step of forming the second recesses R2, a part of the third dielectric layer 50 is formed between the floating gate 43G and the control gate 42G, and another part of the third dielectric layer 50 is formed between the floating gate 43G and the erase gate 41G.

In this embodiment, each of the second recesses R2 is formed corresponding to one of the first recesses R1. In other words, the second recesses R2 are separated from one another and repeatedly disposed in the first direction D1 and the second direction D2 for forming an array configuration. An aperture of each of the second recesses R2 is smaller than an aperture of each of the first recesses R1. An aperture center of each of the second recesses R2 and an aperture center of each of the first recesses R1 substantially overlap each other in the vertical direction D3 preferably. Therefore, the selecting gate 44G, the floating gate 43G and the third dielectric layer 50 are formed surrounding the second recess R2 in the horizontal directions (such as the first direction D1 and the second direction D2) orthogonal to the vertical direction D3. The control gate 42G and the erase gate 41G surrounding the first recess R1 also surround the second recess R2 accordingly, and a part of the floating gate 43G is surrounded by the control gate 42G. In addition, the selecting gate 44 may also include a part of a word line WL, and each of the word lines WL extends in the first direction D1. The portions of each of the word lines WL surrounding the second recesses R2 may be regarded as the selecting gates 44G. Additionally, the tip 43T of the floating gate 43G is lower than the bottom surface 42S of the control gate 42G. The formation of the tip 43T and the size of the floating gate 43G may be modified by controlling the thickness of the third dielectric layer 50 and the process, such as an etching process, of forming the second recesses R2.

Figure 10:
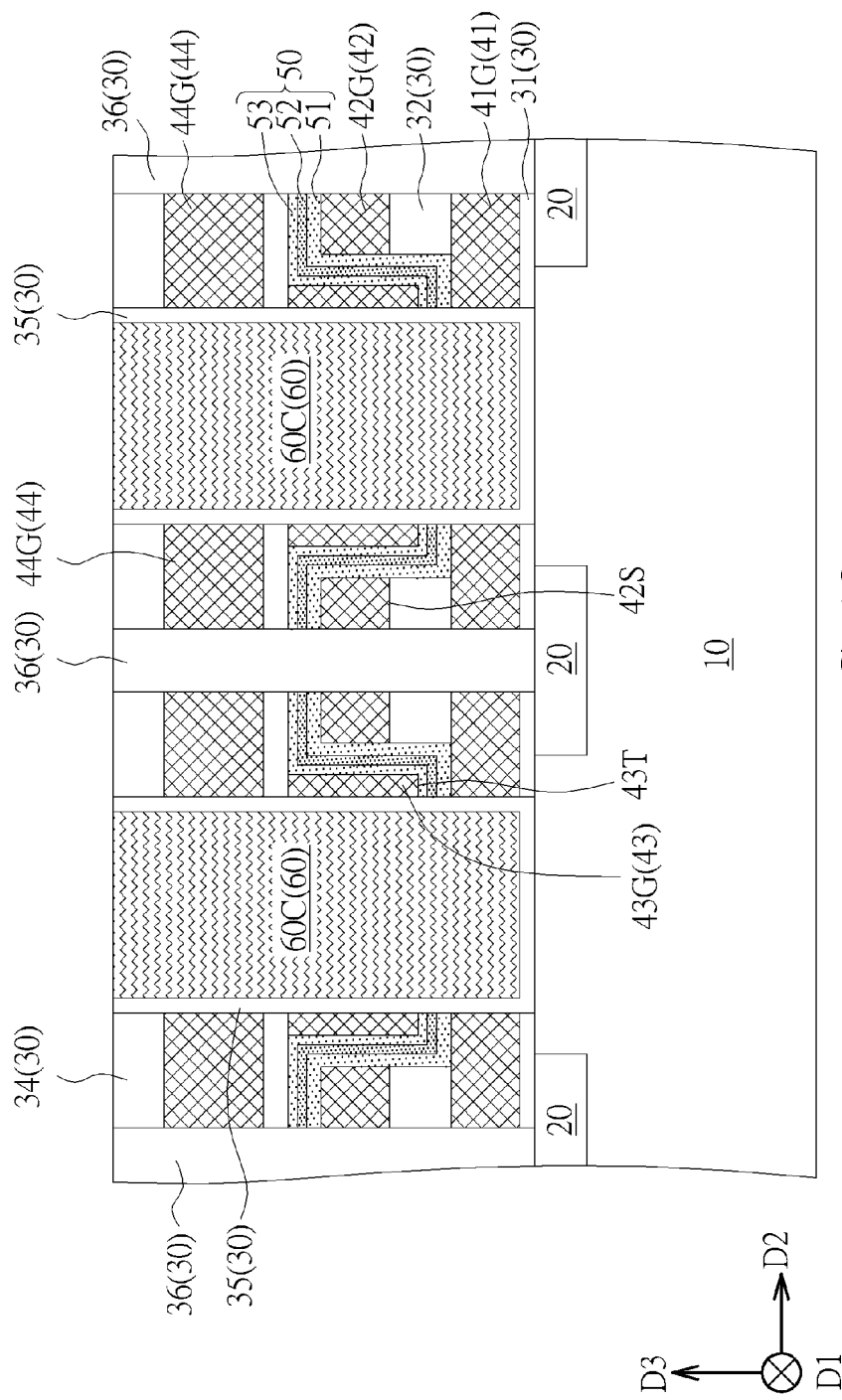

As shown in FIG. 9 and FIG. 10, the second recesses R2 may then be filled with a semiconductor material 60, and a planarization process may be used to remove excess semiconductor material 60 for forming the vertical channel 60C. The semiconductor material 60 may include polysilicon or other appropriate semiconductor materials. Additionally, the second dielectric layer 35 may be conformally formed in the second recesses R2 before the step of forming the semiconductor material 60. The second dielectric layer 35 may include an oxide dielectric material or other appropriate dielectric materials, and the vertical channel 60C subsequently formed is surrounded by the second dielectric layer 35. The selecting gate 44G, the floating gate 43G, the third dielectric layer 50, the control gate 42G, and the erase gate 41G respectively surround a part of the vertical channel 60C in the horizontal directions because the vertical channel 60C is formed in the second recess R2.

As shown in FIG. 1, each of the bit lines 70 may be formed on one of the vertical channels 60C. The bit lines 70 penetrate a single dielectric layer or multiple dielectric layers (such as a dielectric layer 37 and a dielectric layer 38 shown in FIG. 1) covering the vertical channels 60C for contacting and being connected with the vertical channels 60C. In some embodiments, the bit lines may also be electrically connected to the vertical channels 60C via connection structures penetrating the dielectric layer 37 and the dielectric layer 38. The non-volatile memory device 100 shown in FIG. 1 may be formed by the manufacturing method described above. In the non-volatile memory device 100, each of the erase gates 41G, each of the control gates 42G, and each of the selecting gates 44G surround a plurality of vertical channels 60C disposed adjacent to one another in the first direction D1, the floating gates 43G surrounding the vertical channels 60C disposed adjacent to one another in the first direction D1 are separated from one another, and the bit lines 70 connected to the vertical channels 60C disposed adjacent to one another in the first direction D1 are from one another preferably for controlling each of the memory cells 100C independently in an array configuration.

Because the erase gate 41G, the control gate 42G, the floating gate 43G, and the selecting gate 44G of each of the memory cells 100C are disposed overlapping one another in the vertical direction D3 and respectively surround the vertical channel 60C extending vertically in the horizontal directions, the required area of the erase gate 41G, the control gate 42G, the floating gate 43G, and the selecting gate 44G on the substrate 10 may be effectively reduced. The purpose of increasing the density of the memory cells 100C in the non-volatile memory device 100 may be achieved accordingly. Additionally, the floating gate 43G may have the tip 43T extending toward the erase gate 41G by controlling the related processes, and the speed of the erasing operation in each of the memory cells 100C may be enhanced accordingly. In other words, the non-volatile memory device 100 may have the increased density of the memory cells 110C and enhanced electrical operation properties. Additionally, in some embodiments of the present invention, the erase gate 41G, the control gate 42G, and the selecting gate 44G surrounding the vertical channels 60C disposed adjacent to one another in the first direction D1 may be cut and split, and two or more of the memory cells 100C may share one of the vertical channels 60C for further increasing the density of the memory cells.

Figure 11:
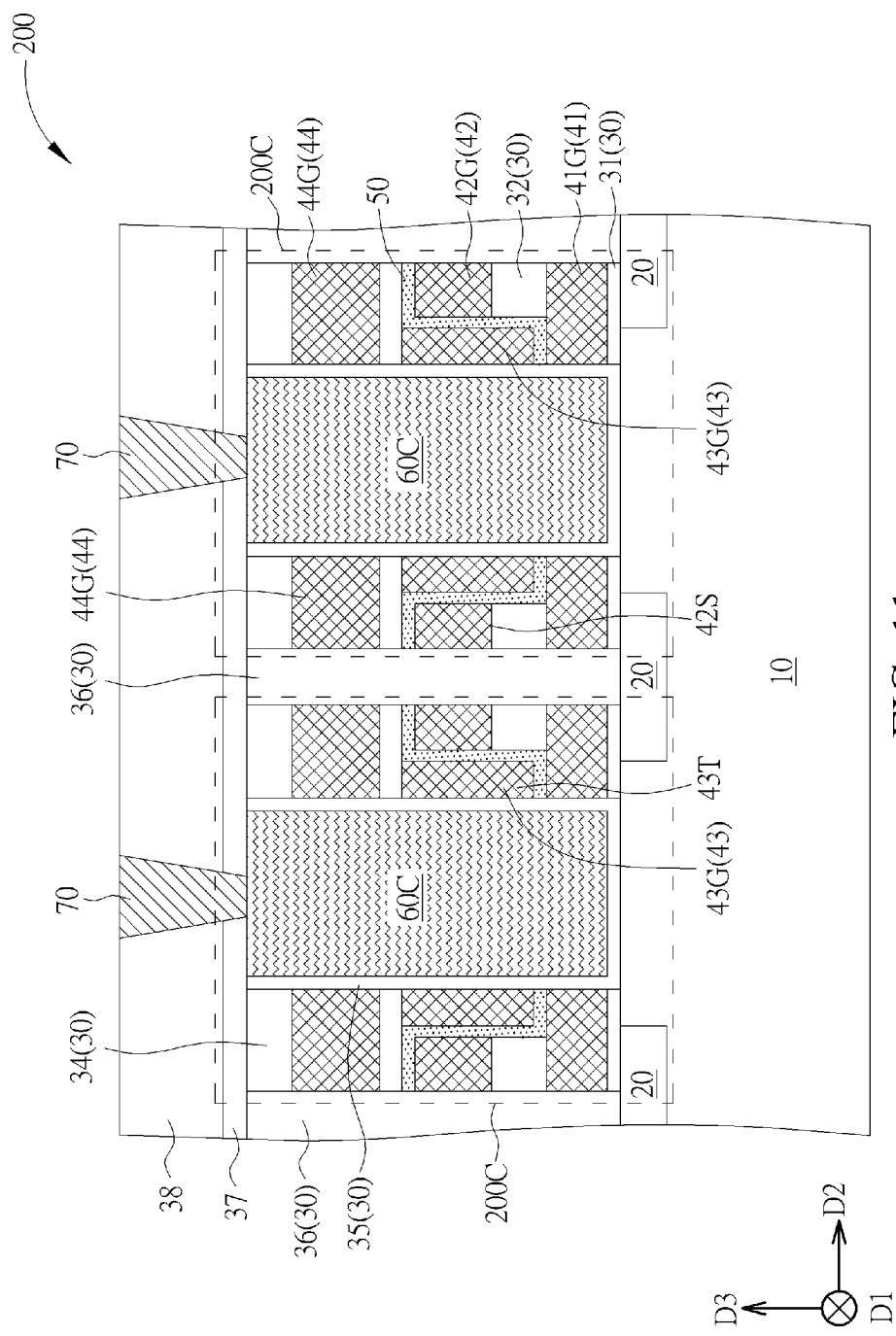
FIG. 11 is a schematic drawing illustrating a non-volatile memory device according to a second embodiment of the present invention.

Please refer to FIG. 11. FIG. 11 is a schematic drawing illustrating a non-volatile memory device 200 according to a second embodiment of the present invention. As shown in FIG. 11, the difference between this embodiment and the first embodiment described above is that, in a memory cell 200C of the non-volatile memory device 200, the third dielectric layer 50 may be a single dielectric material layer, such as a silicon oxide layer, but not limited thereto. In this condition, the floating gate 43G may be a charge trapping material, such as a nitride layer, but not limited thereto. For example, in some embodiments of the preset invention, the floating gate 43G may also include conductive materials such as a conductive polysilicon material when the third dielectric layer 50 is a single dielectric material layer.

To summarize the above descriptions, in the non-volatile memory device and the manufacturing method thereof in the present invention, the vertical channel is formed by filling the recess penetrating a plurality of the conductive layers with the semiconductor material. In each of the memory cells corresponding to the vertical channels, the erase gate, the control gate, the floating gate, and the selecting gate are disposed overlapping one another in the vertical direction and surrounding the vertical channel which extends vertically respectively in the horizontal directions. The required area of the erase gate, the control gate, the floating gate, and the selecting gate on the substrate may be reduced, and the density of the memory cells may be increased accordingly. In addition, the floating gate may have the tip extending toward the erase gate by controlling the related processes, the speed of the erasing operation in each of the memory cells may be enhanced accordingly, and the non-volatile memory device in the present invention may have both the increased density of the memory cells and the improved electrical operation properties.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory (NVM) device, comprising:
   a substrate; and
   a plurality of memory cells, wherein each of the memory cells comprises:
      a vertical channel disposed on the substrate, wherein the vertical channel extends upwards in a vertical direction;
      a control gate disposed on the substrate and surrounding a part of the vertical channel;
      a floating gate disposed on the substrate and surrounding a part of the vertical channel, wherein a part of the floating gate is surrounded by the control gate; and
      an erase gate disposed on the substrate and surrounding a part of the vertical channel, wherein the erase gate is disposed between the substrate and the floating gate in the vertical direction, and the floating gate comprises a tip extending toward the erase gate.

2. The non-volatile memory device of claim 1, wherein the tip is lower than a bottom surface of the control gate in the vertical direction.

3. The non-volatile memory device of claim 1, wherein each of the memory cells further comprises:
   a dielectric layer disposed on the substrate and surrounding a part of the vertical channel, wherein a part of the dielectric layer is disposed between the floating gate and the control gate, and another part of the dielectric layer is disposed between the floating gate and the erase gate.

4. The non-volatile memory device of claim 3, wherein the dielectric layer comprises:
   a first oxide layer;
   a nitride layer disposed on the first oxide layer; and
   a second oxide layer disposed on the nitride layer.

5. The non-volatile memory device of claim 1, wherein each of the memory cells further comprises:
   a selecting gate disposed on the substrate and surrounding a part of the vertical channel, wherein the floating gate, the control gate, and the erase gate are disposed between the selecting gate and the substrate in the vertical direction.

6. The non-volatile memory device of claim 1, further comprising:
   a source line disposed in the substrate, wherein the erase gate, the control gate, and the selecting gate are disposed above the source line in the vertical direction.

7. The non-volatile memory device of claim 1, further comprising:
   a bit line disposed on and connected to the vertical channel.

8. The non-volatile memory device of claim 1, wherein at least some of the memory cells are disposed overlapping one another in the vertical direction.

9. The non-volatile memory device of claim 1, wherein the floating gate comprises a conductive material or a charge trapping material.

10. A manufacturing method of a non-volatile memory (NVM) device, comprising:
    forming an erase gate, a control gate and a floating gate on a substrate, wherein a part of the floating gate is surrounded by the control gate, the erase gate is disposed between the substrate and the floating gate in a vertical direction, and the floating gate comprises a tip extending toward the erase gate; and
    forming a vertical channel on the substrate, wherein the vertical channel extends upwards in the vertical direction, and the floating gate, the control gate, and the erase gate surround the vertical channel respectively.

11. The manufacturing method of the non-volatile memory device of claim 10, wherein the steps of forming the floating gate, the control gate, and the erase gate comprise:
    forming a first conductive layer, a first dielectric layer, and a second conductive layer sequentially on the substrate;

forming a first recess penetrating the second conductive layer, the first dielectric layer, and the first conductive layer for forming the control gate and the erase gate;

forming a floating gate material layer in the first recess; and forming a second recess penetrating the floating gate material layer in the first recess for forming the floating gate, wherein the floating gate material comprises a conductive material or a charge trapping material.

12. The manufacturing method of the non-volatile memory device of claim 11, wherein the first recess comprises:

a first part penetrating the first conductive layer; and a second part penetrating the second conductive layer and the first dielectric layer, wherein the first part and the second part are connected with each other, a width of the second part is larger than a width of the first part, and the second part exposes a part of the first conductive layer in the vertical direction.

13. The manufacturing method of the non-volatile memory device of claim 11, further comprising:

forming a third conductive layer on the substrate after the step of forming the second conductive layer and before the step of forming the second recess, wherein the second recess further penetrates the third conductive layer for forming a selecting gate above the floating gate, the control gate, and the erase gate, and the selecting gate surrounds a part of the vertical channel.

14. The manufacturing method of the non-volatile memory device of claim 13, wherein the selecting gate comprises a part of a word line.

15. The manufacturing method of the non-volatile memory device of claim 11, further comprising:

filling the second recess with a semiconductor material for forming the vertical channel.

16. The manufacturing method of the non-volatile memory device of claim 15, further comprising:

forming a second dielectric layer conformally in the second recess before the step of forming the semiconductor material, wherein the vertical channel is surrounded by the second dielectric layer.

17. The manufacturing method of the non-volatile memory device of claim 11, further comprising:

forming a third dielectric layer on the substrate, wherein the third dielectric layer surrounds a part of the vertical channel, a part of the third dielectric layer is formed between the floating gate and the control gate, and another part of the third dielectric layer is formed between the floating gate and the erase gate.

18. The manufacturing method of the non-volatile memory device of claim 17, wherein the steps of forming the third dielectric layer comprises:

forming a first oxide layer, a nitride layer, and a second oxide layer sequentially and conformally in the first recess before the step of forming the floating gate material layer, wherein the second recess further penetrates the second oxide layer, the nitride layer, and the first oxide layer.

19. The manufacturing method of the non-volatile memory device of claim 10, wherein the tip is lower than a bottom surface of the control gate in the vertical direction.

20. The manufacturing method of the non-volatile memory device of claim 10, further comprising:

forming a source line in the substrate, wherein the erase gate and the control gate are formed above the source line in the vertical direction.

\* \* \* \* \*